United States Patent
Gill

(10) Patent No.: US 7,360,297 B2
(45) Date of Patent: Apr. 22, 2008

(54) MAGNETORESISTIVE SENSOR WITH ANTIPARALLEL COUPLED LEAD/SENSOR OVERLAP REGION

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 580 days.

(21) Appl. No.: 11/067,198

(22) Filed: Feb. 24, 2005

(65) Prior Publication Data

US 2005/0141145 A1 Jun. 30, 2005

Related U.S. Application Data

(62) Division of application No. 10/290,825, filed on Nov. 8, 2002, now Pat. No. 6,876,527.

(51) Int. Cl.
*H04R 31/00* (2006.01)
*G11B 5/39* (2006.01)

(52) U.S. Cl. .................. 29/603.14; 360/324.12
(58) Field of Classification Search ............. 29/603.14, 29/603.13; 360/324.12, 324.11, 324.1, 324.2
See application file for complete search history.

(56) References Cited

U.S. PATENT DOCUMENTS

| | | | |
|---|---|---|---|
| 5,959,810 A | * | 9/1999 | Kakihara et al. ...... 360/324.12 |
| 6,052,262 A | * | 4/2000 | Kamiguchi et al. .... 360/324.12 |
| 6,570,745 B1 | | 5/2003 | Gill ....................... 360/324.12 |
| 2001/0028540 A1 | | 10/2001 | Sakaguci et al. ...... 360/324.12 |
| 2002/0024781 A1 | | 2/2002 | Ooshima et al. ....... 360/324.12 |
| 2003/0189798 A1 | | 10/2003 | Lin et al. .................... 360/322 |

FOREIGN PATENT DOCUMENTS

| | | |
|---|---|---|
| JP | 2001067625 | 8/1999 |
| JP | 2001155313 A | 6/2001 |

* cited by examiner

*Primary Examiner*—Angel Castro
(74) *Attorney, Agent, or Firm*—Matthew S. Zises

(57) ABSTRACT

A spin valve sensor with an antiparallel coupled lead/sensor overlap region is provided comprising a ferromagnetic bias layer antiparallel coupled to a free layer in first and second passive regions where first and second lead layers overlap the spin valve sensor layers. The ferromagnetic material of the bias layer in a track width region defined by a space between the first and second lead layers is converted to a nonmagnetic oxide layer allowing the free layer in the track width region to rotate in response to signal fields from a magnetic disk.

3 Claims, 6 Drawing Sheets

MAGNETORESISTIVE SENSOR WITH ANTIPARALLEL COUPLED LEAD/SENSOR OVERLAP REGION

REFERENCE TO RELATED APPLICATION

This is a divisional of application 10/290,825 filed Nov. 08, 2002 now U.S. Pat. No. 6,876,527.

BACKGROUND OF THE INVENTION

1. Field of the Invention

This invention relates in general to spin valve magnetoresistive sensors for reading information signals from a magnetic medium and, in particular, to a lead overlay spin valve sensor with an improved lead/sensor overlap region.

2. Description of Related Art

Computers often include auxiliary memory storage devices having media on which data can be written and from which data can be read for later use. A direct access storage device (disk drive) incorporating rotating magnetic disks is commonly used for storing data in magnetic form on the disk surfaces. Data is recorded on concentric, radially spaced tracks on the disk surfaces. Magnetic heads including read sensors are then used to read data from the tracks on the disk surfaces.

In high capacity disk drives, magnetoresistive (MR) read sensors, commonly referred to as MR sensors, are the prevailing read sensors because of their capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

The conventional MR sensor operates on the basis of the anisotropic magnetoresistive (AMR) effect in which an MR element resistance varies as the square of the cosine of the angle between the magnetization in the MR element and the direction of sense current flowing through the MR element. Recorded data can be read from a magnetic medium because the external magnetic field from the recorded magnetic medium (the signal field) causes a change in the direction of magnetization in the MR element, which in turn causes a change in resistance in the MR element and a corresponding change in the sensed current or voltage.

Another type of MR sensor is the giant magnetoresistance (GMR) sensor manifesting the GMR effect. In GMR sensors, the resistance of the MR sensing layer varies as a function of the spin-dependent transmission of the conduction electrons between magnetic layers separated by a non-magnetic layer (spacer) and the accompanying spin-dependent scattering which takes place at the interface of the magnetic and nonmagnetic layers and within the magnetic layers.

GMR sensors using only two layers of ferromagnetic material (e.g., Ni—Fe) separated by a layer of nonmagnetic material (e.g., copper) are generally referred to as spin valve (SV) sensors manifesting the SV effect.

FIG. 1 shows a prior art SV sensor 100 comprising end regions 104 and 106 separated by a central region 102. A first ferromagnetic layer, referred to as a pinned layer 120, has its magnetization typically fixed (pinned) by exchange coupling with an antiferromagnetic (AFM) layer 125. The magnetization of a second ferromagnetic layer, referred to as a free layer 110, is not fixed and is free to rotate in response to the magnetic field from the recorded magnetic medium (the signal field). The free layer 110 is separated from the pinned layer 120 by a non-magnetic, electrically conducting spacer layer 115. Hard bias layers 130 and 135 formed in the end regions 104 and 106, respectively, provide longitudinal bias for the free layer 110. Leads 140 and 145 formed on hard bias layers 130 and 135, respectively, provide electrical connections for sensing the resistance of SV sensor 100. IBM's U.S. Pat. No. 5,206,590 granted to Dieny et al., incorporated herein by reference, discloses a GMR sensor operating on the basis of the SV effect.

Another type of spin valve sensor is an antiparallel (AP) spin valve sensor. The AP-pinned valve sensor differs from the simple spin valve sensor in that an AP-pinned structure has multiple thin film layers instead of a single pinned layer. The AP-pinned structure has an antiparallel coupling (APC) layer sandwiched between first and second ferromagnetic pinned layers. The first pinned layer has its magnetization oriented in a first direction by exchange coupling to the antiferromagnetic pinning layer. The second pinned layer is immediately adjacent to the free layer and is antiparallel exchange coupled to the first pinned layer because of the minimal thickness (in the order of 8 Å) of the APC layer between the first and second pinned layers. Accordingly, the magnetization of the second pinned layer is oriented in a second direction that is antiparallel to the direction of the magnetization of the first pinned layer.

The AP-pinned structure is preferred over the single pinned layer because the magnetizations of the first and second pinned layers of the AP-pinned structure subtractively combine to provide a net magnetization that is less than the magnetization of the single pinned layer. The direction of the net magnetization is determined by the thicker of the first and second pinned layers. A reduced net magnetization equates to a reduced demagnetization field from the AP-pinned structure. Since the antiferromagnetic exchange coupling is inversely proportional to the net pinning magnetization, this increases exchange coupling between the first pinned layer and the antiferromagnetic pinning layer. The AP-pinned spin valve sensor is described in commonly assigned U.S. Pat. No. 5,465,185 to Heim and Parkin which is incorporated by reference herein.

A typical spin valve sensor has top and bottom surfaces and first and second side surfaces which intersect at an air bearing surface (ABS) where the ABS is an exposed surface of the sensor that faces the magnetic disk. Prior art read heads employ first and second hard bias layers and first and second lead layers that abut the first and second side surfaces for longitudinally biasing and stabilizing the free layer in the sensor and conducting a sense current transversely through the sensor. The track width of the head is measured between the centers of the side surfaces of the free layer. In an effort to reduce the the track width to submicron levels it has been found that the hard bias layers make the free layer magnetically stiff so that its magnetic moment does not freely respond to field signals from a rotating magnetic disk. Accordingly, there is a strong-felt need to provide submicron track width spin valve sensors which are still sensitive to the signals from the rotating magnetic disk along with longitudinal biasing of the free layer transversely so that the free layer is kept in a single magnetic domain state.

SUMMARY OF THE INVENTION

Accordingly, it is an object of the present invention to disclose a spin valve sensor with a highly stabilized free layer which is highly responsive to signals from a rotating magnetic disk.

It is another object of the present invention to disclose a spin valve sensor with an antiparallel coupled lead/sensor overlap region.

It is a further object of the present invention to disclose a spin valve sensor having a ferromagnetic layer antiparallel coupled to the free layer in the lead overlap (passive) regions.

It is yet another object of the present invention to disclose a method of making a spin valve sensor having a ferromagnetic layer antiparallel coupled to the free layer in the lead overlap regions.

In accordance with the principles of the present invention, there is disclosed a preferred embodiment of the present invention wherein a spin valve (SV) sensor has a transverse length between first and second side surfaces which is divided into a track width region between first and second passive regions wherein the track width region is defined by first and second lead layers. The free layer is at the top of the sensor. A ferromagnetic bias layer having a thickness nearly equal to the free layer thickness is antiparallel coupled to the free layer in the first and second passive regions. In the track width region, the ferromagnetic bias layer is oxidized in a subsequent fabrication step to form a nonmagnetic oxide. Because of its small net magnetization, the antiparallel coupled free layer and bias layer combination is insensitive to signals from the magnetic disk resulting in stabilization of the free layer in the first and second passive regions. In the track width region, the free layer is not antiparallel coupled to the bias layer due to conversion of the ferromagnetic bias layer to a nonmagnetic oxide layer in the track width region by the oxidation step and the free layer magnetization is free to rotate in the presence of signal fields.

The above as well as additional objects, features, and advantages of the present invention will become apparent in the following detailed description.

BRIEF DESCRIPTION OF THE DRAWINGS

For a fuller understanding of the nature and advantages of the present invention, as well as of the preferred mode of use, reference should be made to the following detailed description read in conjunction with the accompanying drawings. In the following drawings, like reference numerals designate like or similar parts throughout the drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 1:
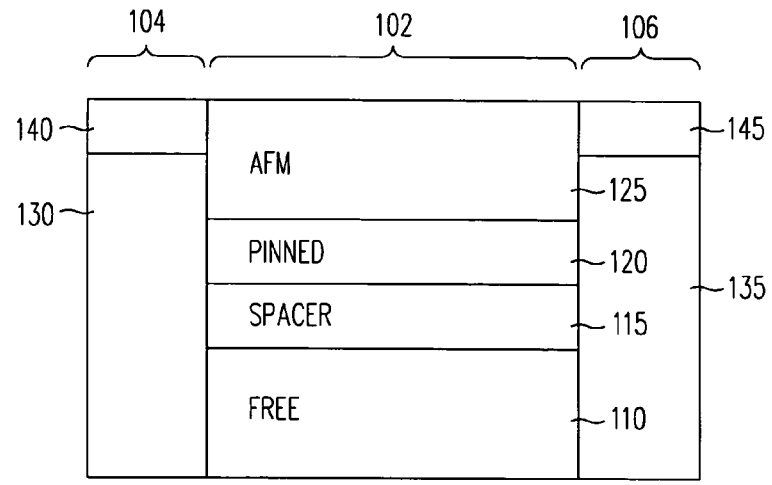
FIG. 1 is an air bearing surface view, not to scale, of a prior art SV sensor.
Figure 2:
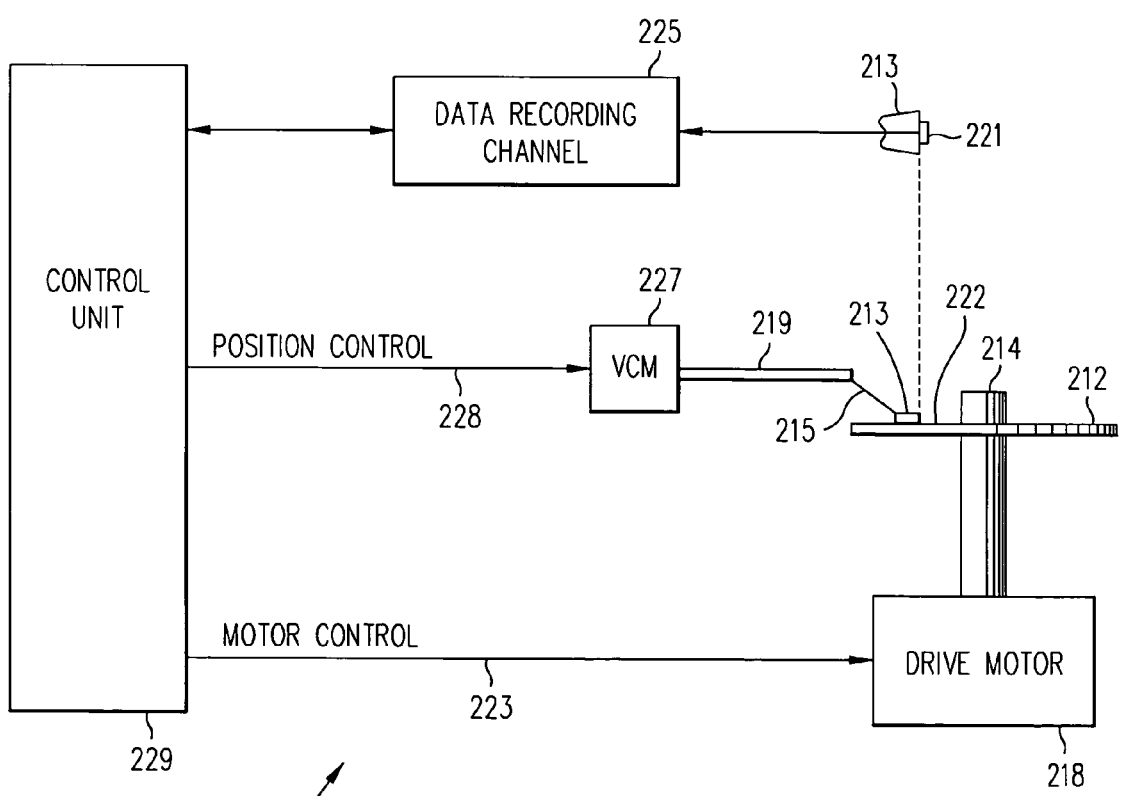
FIG. 2 is a simplified diagram of a magnetic recording disk drive system using the SV sensor of the present invention.

Referring now to FIG. 2, there is shown a disk drive 200 embodying the present invention. As shown in FIG. 2, at least one rotatable magnetic disk 212 is supported on a spindle 214 and rotated by a disk drive motor 218. The magnetic recording media on each disk is in the form of an annular pattern of concentric data tracks (not shown) on the disk 212.

At least one slider 213 is positioned on the disk 212, each slider 213 supporting one or more magnetic read/write heads 221 where the head 221 incorporates the SV sensor of the present invention. As the disks rotate, the slider 213 is moved radially in and out over the disk surface 222 so that the heads 221 may access different portions of the disk where desired data is recorded. Each slider 213 is attached to an actuator arm 219 by means of a suspension 215. The suspension 215 provides a slight spring force which biases the slider 213 against the disk surface 222. Each actuator arm 219 is attached to an actuator 227. The actuator as shown in FIG. 2 may be a voice coil motor (VCM). The VCM comprises a coil movable within a fixed magnetic field, the direction and speed of the coil movements being controlled by the motor current signals supplied by a controller 229.

During operation of the disk storage system, the rotation of the disk 212 generates an air bearing between the slider 213 (the surface of the slider 213 which includes the head 321 and faces the surface of the disk 212 is referred to as an air bearing surface (ABS)) and the disk surface 222 which exerts an upward force or lift on the slider. The air bearing thus counter-balances the slight spring force of the suspension 215 and supports the slider 213 off and slightly above the disk surface by a small, substantially constant spacing during normal operation.

The various components of the disk storage system are controlled in operation by control signals generated by the control unit 229, such as access control signals and internal clock signals. Typically, the control unit 229 comprises logic control circuits, storage chips and a microprocessor. The control unit 229 generates control signals to control various system operations such as drive motor control signals on line 223 and head position and seek control signals on line 228. The control signals on line 228 provide the desired current profiles to optimally move and position the slider 213 to the desired data track on the disk 212. Read and write signals are communicated to and from the read/write heads 221 by means of the recording channel 225. Recording channel 225 may be a partial response maximum likelihood (PMRL) channel or a peak detect channel. The design and implementation of both channels are well known in the art and to persons skilled in the art. In the preferred embodiment, recording channel 225 is a PMRL channel.

The above description of a typical magnetic disk storage system, and the accompanying illustration of FIG. 2 are for representation purposes only. It should be apparent that disk storage systems may contain a large number of disks and actuator arms, and each actuator arm may support a number of sliders.

Figure 3:
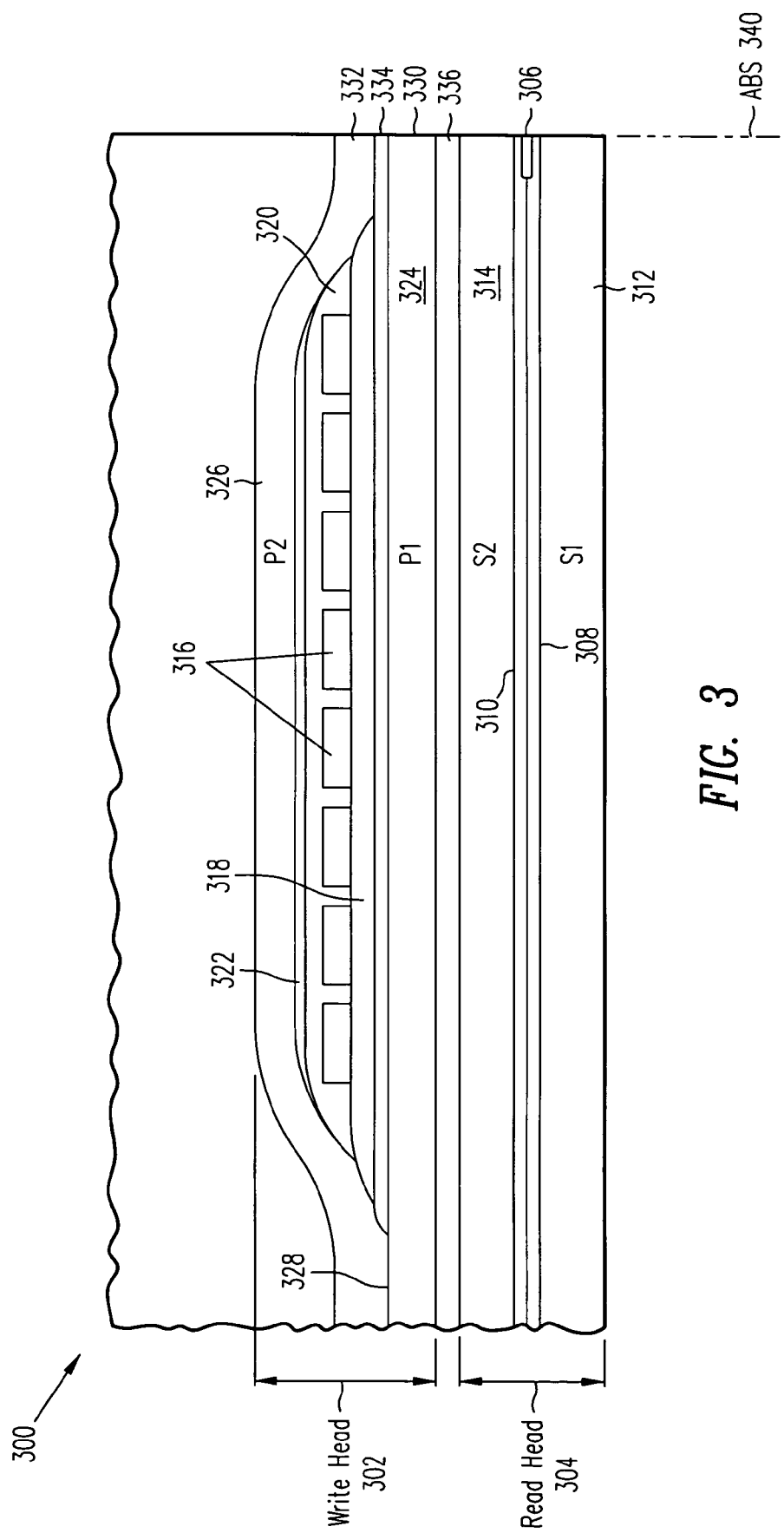
FIG. 3 is a vertical cross-section view, not to scale, of a "piggyback" read/write magnetic head.

FIG. 3 is a side cross-sectional elevation view of a "piggyback" magnetic read/write head 300, which includes a write head portion 302 and a read head portion 304, the read head portion employing a spin valve sensor 306 according to the present invention. The sensor 306 is sandwiched between nonmagnetic insulative first and second read gap layers 308 and 310, and the read gap layers are sandwiched between ferromagnetic first and second shield layers 312 and 314. In response to external magnetic fields, the resistance of the sensor 306 changes. A sense current Is conducted through the sensor causes these resistance changes to be manifested as potential changes. These potential changes are then processed as readback signals by the processing circuitry of the data recording channel 246 shown in FIG. 2.

The write head portion 302 of the magnetic read/write head 300 includes a coil layer 316 sandwiched between first and second insulation layers 318 and 320. A third insulation layer 322 may be employed for planarizing the head to eliminate ripples in the second insulation layer 320 caused by the coil layer 316. The first, second and third insulation layers are referred to in the art as an insulation stack. The coil layer 316 and the first, second and third insulation layers 38, 320 and 322 are sandwiched between first and second pole piece layers 324 and 326. The first and second pole piece layers 324 and 326 are magnetically coupled at a back gap 328 and have first and second pole tips 330 and 332 which are separated by a write gap layer 334 at the ABS 340. An insulation layer 336 is located between the second shield layer 314 and the first pole piece layer 324. Since the second shield layer 314 and the first pole piece layer 324 are separate layers this read/write head is known as a "piggyback" head.

Figure 4:
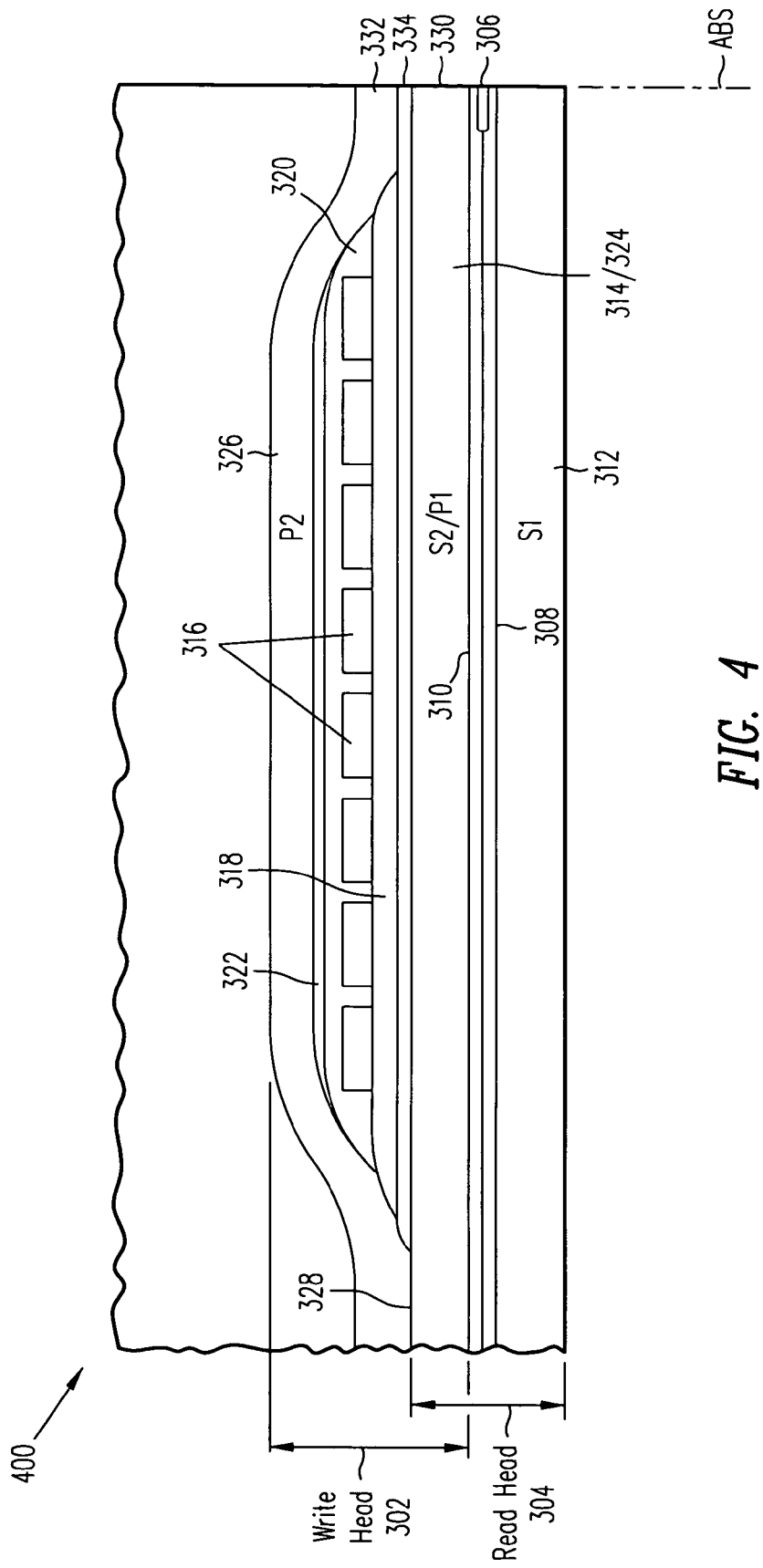
FIG. 4 is a vertical cross-section view, not to scale, of a "merged" read/write magnetic head.

FIG. 4 is the same as FIG. 3 except the second shield layer 414 and the first pole piece layer 424 are a common layer. This type of read/write head is known as a "merged" head 400. The insulation layer 336 of the piggyback head in FIG. 3 is omitted in the merged head 400 of FIG. 4.

Figure 5:
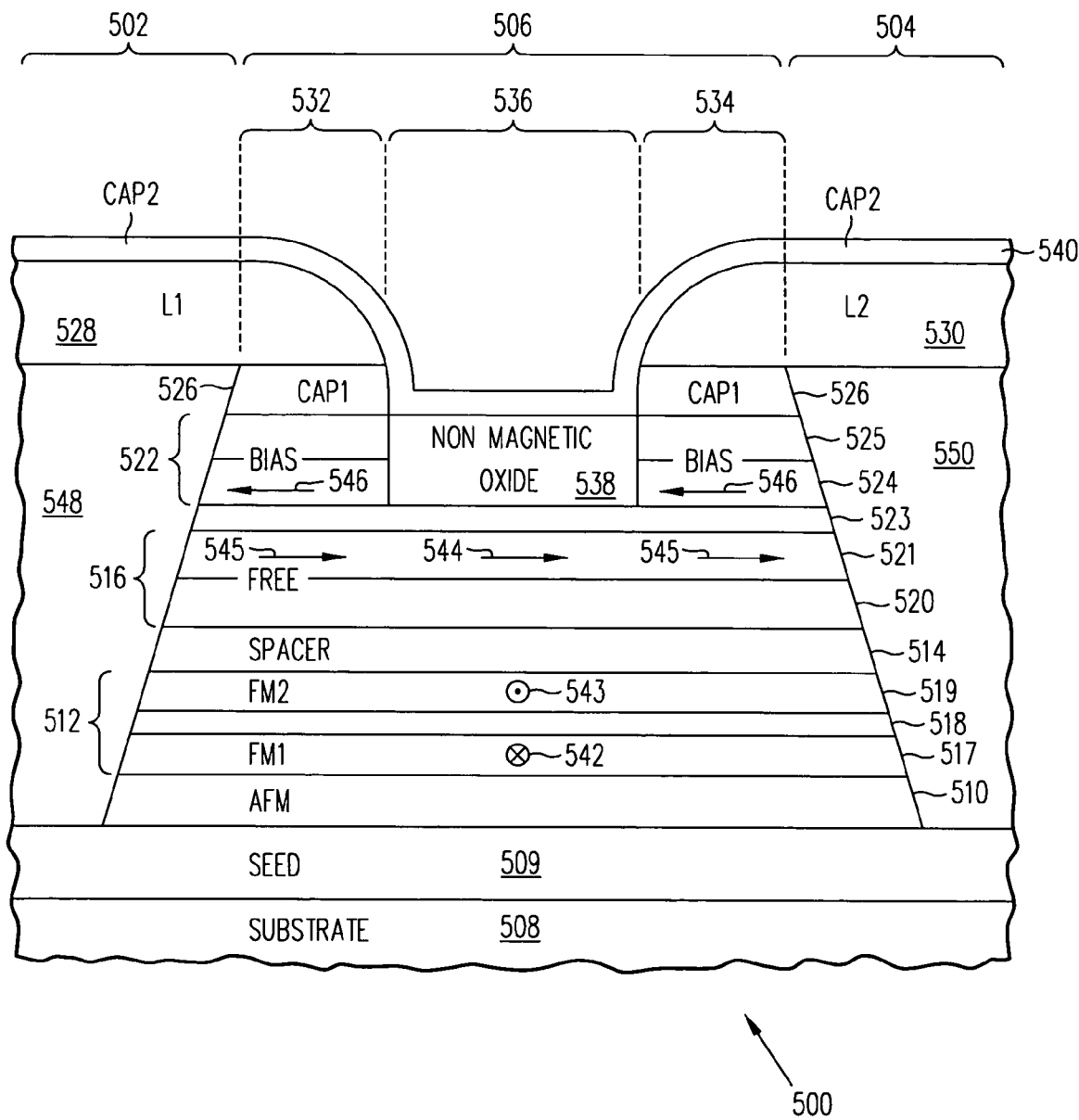
FIG. 5 is an air bearing surface view, not to scale, of an embodiment of a lead overlay SV sensor of the present invention.
Figure 6A:
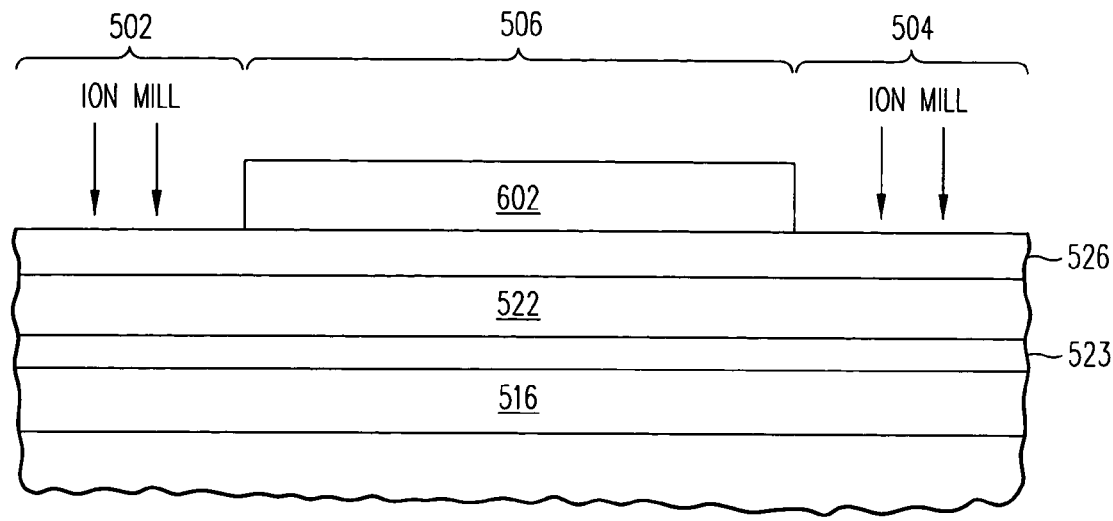
FIGS. 6a-6d are air bearing surface views, not to scale, of the SV sensor of FIG. 5 illustrating sequential steps of making the sensor by the method of the present invention.
Figure 6B:
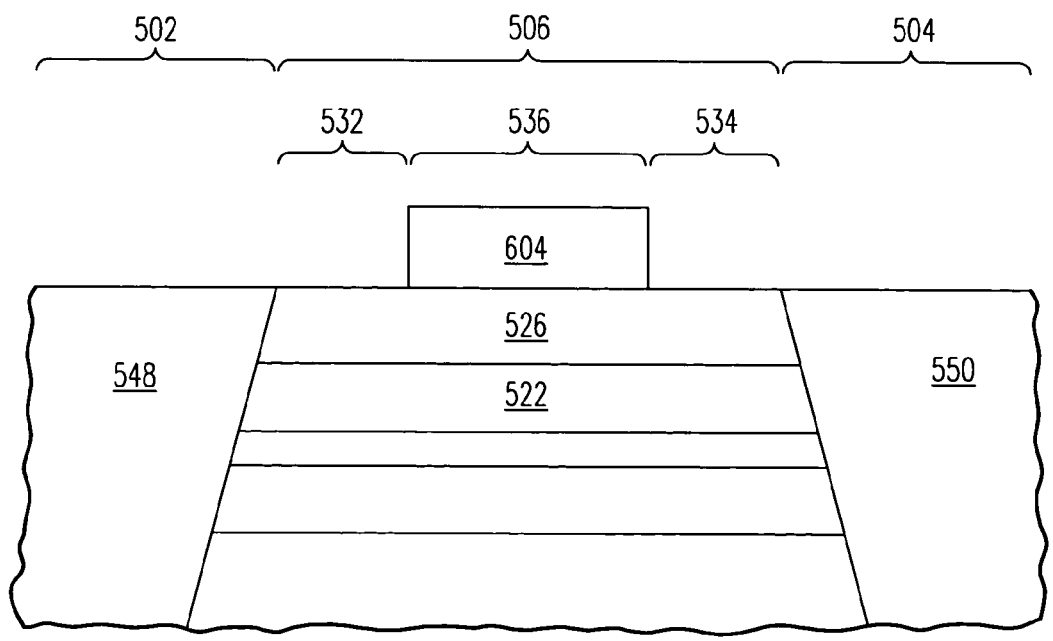
Figure 6C:
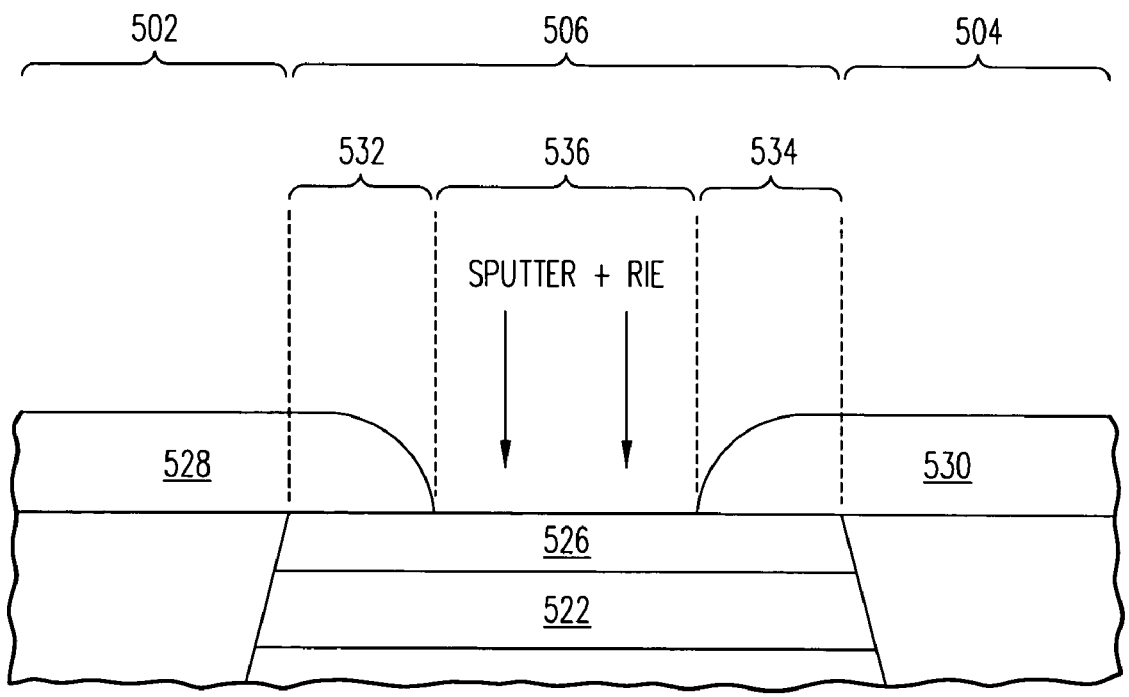
Figure 6D:
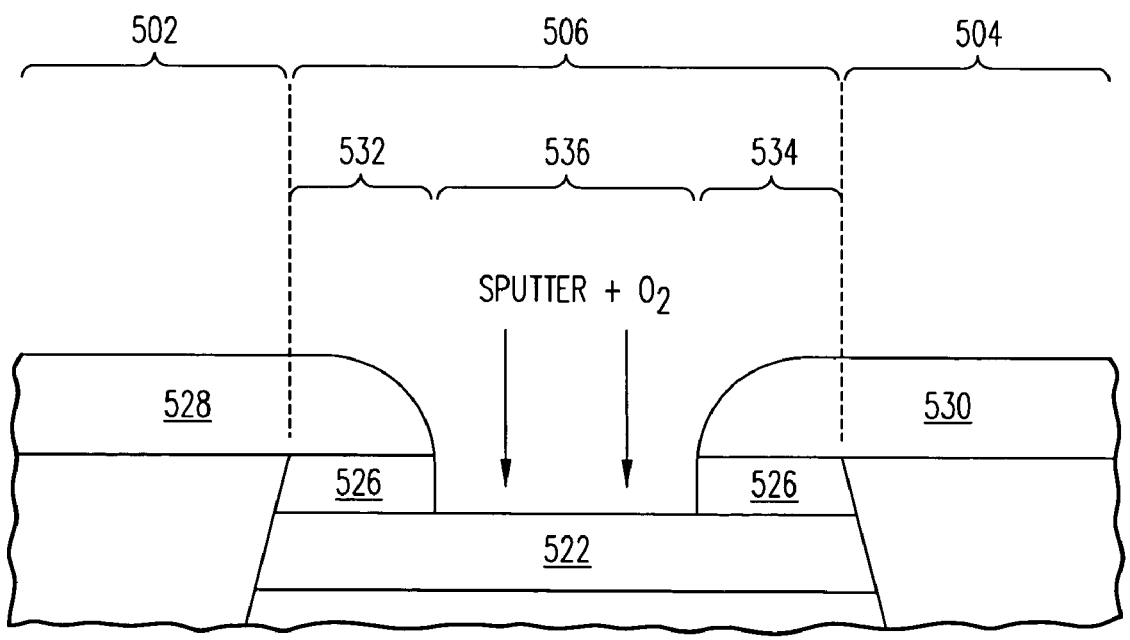

FIG. 5 depicts an air bearing surface (ABS) view, not to scale, of a lead overlay spin valve sensor 500 according to a preferred embodiment of the present invention. The SV sensor 500 comprises end regions 502 and 504 separated from each other by a central region 506. The substrate 508 can be any suitable substance including glass, semiconductor material, or a ceramic material such as alumina ($Al_2O_3$). The seed layer 509 is a layer or layers deposited to modify the crystallographic texture or grain size of the subsequent layers. An antiferromagnetic (AFM) layer 510 is deposited over the over the seed layer. An antiparallel (AP)-pinned layer 512, a conductive spacer layer 514 and a free layer 516 are deposited sequentially over the AFM layer 510. The AFM layer may have a thickness sufficient to provide the desired exchange properties to act as a pinning layer for the AP-pinned layer 512. In the preferred embodiment, the AFM layer 510 is thinner than desirable for a pinning layer and is used to provide an additional seed layer to help promote improved properties of the subsequent layers of the sensor. The AP-pinned layer 512 comprises a first ferromagnetic (FM1) layer 517 and a second ferromagnetic (FM2) layer 519 separated by an antiparallel coupling (APC) layer 518 that allows the FM1 layer 517 and the FM2 layer 519 to be strongly AP-coupled as indicated by the antiparallel magnetizations 542 (represented by the tail of an arrow pointing into the paper) and 543 (represented by the head of an arrow pointing out of the paper), respectively. In the preferred embodiment, the AP-coupled layer 512 is designed to be a self-pinned layer as is known to the art. The free layer 516 comprises a ferromagnetic first free sublayer 520 of Co—Fe and a ferromagnetic second free sublayer 521 of Ni—Fe.

A bias layer 522 separated from the free layer 516 by an APC layer 523 comprises a ferromagnetic first bias sublayer 524 of Co—Fe deposited over the APC layer 523 and a ferromagnetic second bias sublayer 525 of Ni—Fe deposited over the first bias sublayer 524. The APC layer 523 allows the bias layer 522 to be strongly AP-coupled to the free layer 516. A first cap layer 526 is formed on the bias layer 522.

First and second leads L1 528 and L2 530 are formed over the cap layer 526 in the passive regions 532 and 534 and over the end regions 502 and 504 overlapping the central region 506 of the sensor in the first and second passive regions. A space between L1 528 and L2 530 in the central region 506 of the sensor defines the track width region 536 which defines the track width of the read head and which can have submicron dimensions. The first cap layer 536 in the track width region 536 between L1 and L2 is removed by a sputter etch and reactive ion etch (RIE) process followed by a sputter etch and oxidation process to convert the ferromagnetic material of bias layer 522 into a nonmagnetic oxide layer 538 in the track width region 536. A second cap layer 540 is formed over the leads L1 528 and L2 530 in the end regions 502, 504 and the passive regions 532, 534 and over the nonmagnetic oxide layer 538 in the track width region 536.

The AP-pinned layer 512 has the magnetizations of the FMJ layer 517 and the FM2 layer 519 pinned in directions perpendicular to the ABS as indicated by arrow tail 542 and arrow head 543 pointing into and out of the plane of the paper, respectively. In the track width region 536, the magnetization of the free layer 516 indicated by the arrow 544 is the net magnetization of the ferromagnetically coupled first and second free sublayers 520 and 521 and is free to rotate in the presence of an external (signal) magnetic field. The magnetization 544 is preferably oriented parallel to the ABS in the absence of an external magnetic field. In the first and second passive regions 532 and 534, the free layer 516 is strongly AP-coupled to the bias layer 522.

The magnetization 546 of the bias layer 522 in the first and second passive regions 532 and 534 is the net magnetization of the ferromagnetically coupled first and second bias sublayers 524 and 525. Due to the presence of the APC layer 523 which allows the free layer 516 to be strongly AP-coupled to the bias layer 522, the magnetization 546 of the bias layer is oriented antiparallel to the magnetization 545 of the free layer. The effect of this AP-coupling is stabilization of the free layer 516 in the passive regions 532 and 534 since the magnetization 545 does not rotate in response to external fields thus inhibiting undesirable side reading on the rotating magnetic disk.

End region layers 548 and 550 abutting the spin valve layers may be formed of electrically insulating material such as alumina, or alternatively, may be formed of a suitable hard bias material in order to provide a longitudinal bias field to the free layer 516 to ensure a single magnetic domain state in the free layer. An advantage of having the hard bias material forming the end region layers 548 and 550 is that these layers are remote from the track width region 536 so that they do not magnetically stiffen the magnetization 544 of the free layer in this region, which stiffening makes the free layer insensitive to field signals from the rotating magnetic disk.

Leads L1 528 and L2 530 deposited in the end regions 502 and 504, respectively, provide electrical connections for the flow of a sensing current $I_s$ from a current source to the SV sensor 500. A signal detector which is electrically connected to the leads senses the change of resistance due to changes induced in the free layer 516 by the external magnetic field (e.g., field generated by a data bit stored on a rotating magnetic disk). The external field acts to rotate the direction of the magnetization 544 of the free layer 516 relative to the direction of the magnetization 543 of the pinned layer 519 which is preferably pinned perpendicular to the ABS.

The fabrication of SV 500 is described with reference to FIGS. 5 and 6a-d. The SV sensor 500 is fabricated in a magnetron sputtering or an ion beam sputtering system to sequentially deposit the multilayer structure shown in FIG. 5. The sputter deposition process is carried out in the presence of a longitudinal magnetic field of about 40 Oe. The seed layer 509 is formed on the substrate 508 by sequentially depositing a layer of alumina ($Al_2O_3$) having a thickness of about 30 Å, a layer of Ni—Fe—Cr having a thickness of about 20 Å and a layer of Ni—Fe having a thickness of about 8 Å. The AFM layer 510 of PtMn, having a thickness in the range of 4-150 Å, is deposited over the seed layer 509. The AP-pinned layer 512 is formed over the AFM layer by sequentially depositing the EM1 layer 517 of Co—Fe having a thickness of about 10 Å, the APC layer 518 of ruthenium (Ru) having a thickness of about 8 Å and the EM2 layer 519 of Co—Fe having a thickness of about 19 Å. The spacer layer 514 of copper (Cu) having a thickness of about 20 Å is deposited over the WM2 layer 519 and the free layer 516 is deposited over the spacer layer 514 by first depositing the first free sublayer 520 of Co—Fe having a thickness of about 10 Å followed by the second free sublayer 521 of Ni—Fe having a thickness of about 15 Å. The APC layer 523 of Ru having a thickness of about 8 Å is deposited over the second free sublayer 521. The bias layer 522 is deposited over the APC layer 523 by first depositing the first bias sublayer 524 of Co—Fe having a thickness of about 10 Å followed by the second free sublayer 525 of Ni—Fe having a thickness of about 20 Å. A first cap layer 526 deposited over the bias layer 522 comprises a first sublayer of tantalum (Ta) having a thickness of about 20 Å and a second sublayer of ruthenium (Ru) having a thickness of about 20 Å over the first sublayer. Alternatively, the first cap layer may be formed of a single layer of tantalum (Ta) having a thickness of 40 Å.

After the deposition of the central region 506 is completed, photoresist 602 is applied and exposed in a photolithography tool to mask SV sensor 500 in the central region 506 and then developed in a solvent to expose end regions 502 and 504. The layers in the unmasked end regions 502 and 504 are removed by ion milling and end region layers 548 and 550 of alumina ($Al_2O_3$) are deposited in the end regions. Alternatively, longitudinal hard bias layers may be formed in the end regions 502 and 504 in order to provide a longitudinal bias field to the free layer 516 to ensure a single magnetic domain state in the free layer.

Photoresist 604 and photolithography processes are used to define the track width region 536 in the central region 506 of the SV sensor 500. First and second leads L1 528 and L2 530 of rhodium (Rh) having a thickness in the range 200-600 Å are deposited over the end regions 502 and 504 and over the unmasked first cap layer 526 in and in the first and second passive regions 532 and 534 which provide the desired lead/sensor overlap. After removal of the photoresist mask 604 in the track width region 536, the leads L1 528 and L2 530 are used as masks for a sputter etch and reactive ion etch (RIE) process to remove the first cap layer 526 in the track width region 536. After removal of the first cap layer, the exposed portion of the bias layer 522 in the track width region 536 is sputter etched with an oxygen containing gas to convert the ferromagnetic bias layers 524 and 525 into a nonmagnetic oxide layer 538. The second cap layer 540 of rhodium (Rh), or alternatively ruthenium (Ru), having a thickness of about 40 Å is deposited over the leads L1 528 and L2 530 in the end regions 502 and 504 and the passive regions 532 and 534 and over the nonmagnetic oxide layer 538 in the track field region 536.

It should be understood that the antiparallel coupled bias/free layer structure in the lead/sensor overlap regions (passive regions 532 and 534) of the present invention may be used with any bottom spin valve sensor (SV) sensor having the pinned layers located near the bottom of the stacked layers). In the bottom spin valve structure, the free layer can be easily AP-coupled to a bias layer and oxidation of the ferromagnetic bias layer to form a nonmagnetic oxide in the track width region can be easily accomplished. In particular, the AP-coupled bias free layer structure in the lead/sensor overlap regions may be used with AFM pinning simple pinned or AP-pinned SV sensors and with self-pinned SV sensors.

While the present invention has been particularly shown and described with reference to the preferred embodiments, it will be understood by those skilled in the art that various changes in form and detail may be made without departing from the spirit, scope and teaching of the invention. Accordingly, the disclosed invention is to be considered merely as illustrative and limited only as specified in the appended claims.

I claim:

1. A method of making a spin valve (SV) sensor having first and second passive regions and a central track width region transversely disposed between said first and second passive regions, the method comprising the steps of:
   depositing sequentially a pinned layer, a spacer layer and a free layer;
   depositing a ferromagnetic bias layer antiparallel coupled to the free layer by an antiparallel coupling layer sandwiched between the free layer and the bias layer;
   depositing a cap layer over the bias layer;
   depositing first and second lead layers over the first cap layer, said first and second lead layers overlapping the first and second passive regions, respectively, wherein the track width region between the first and second passive regions is defined by a space between the first and second lead layers;
   removing the first cap layer in the track width region between the first and second lead layers;
   converting the ferromagnetic material of the bias layer in the track width region into a nonmagnetic oxide layer; and
   depositing a second cap layer.

2. The method as recited in claim 1 wherein the step of removing the cap layer in the track width region uses a sputter etch and reactive ion etch process.

3. The method as recited in claim 1 wherein the step of converting the ferromagnetic material of the bias layer in the track width region into a nonmagnetic oxide layer uses a sputter etch process with an oxygen containing gas.

* * * * *